United States Patent
Aono et al.

(10) Patent No.: US 8,438,718 B2
(45) Date of Patent: May 14, 2013

(54) MANUFACTURING METHOD OF COMBINED SENSOR

(75) Inventors: Takanori Aono, Hitachinaka (JP); Kengo Suzuki, Hitachinaka (JP); Akira Koide, Inashiki (JP); Masahide Hayashi, Mito (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 59 days.

(21) Appl. No.: 13/028,592

(22) Filed: Feb. 16, 2011

(65) Prior Publication Data

US 2011/0209815 A1  Sep. 1, 2011

(30) Foreign Application Priority Data

Feb. 26, 2010 (JP) ................................. 2010-041246

(51) Int. Cl.
*G01R 3/00* (2006.01)

(52) U.S. Cl.
USPC ................ 29/595; 29/428; 29/594; 29/609.1; 29/855; 29/858; 73/504.12; 257/666; 257/682; 257/686

(58) Field of Classification Search ............ 29/428, 29/434, 469, 592.1, 594, 595, 609.1, 841, 29/855, 858; 73/504.12; 257/666, 682, 686; 156/146
See application file for complete search history.

(56) References Cited

U.S. PATENT DOCUMENTS

| 5,742,007 | A  | * | 4/1998  | Kornowski et al. | 174/535 |
|-----------|----|---|---------|------------------|---------|
| 7,605,466 | B2 | * | 10/2009 | Aimi et al.      | 257/723 |
| 7,692,292 | B2 | * | 4/2010  | Higashi et al.   | 257/710 |
| 8,035,209 | B2 | * | 10/2011 | Gonska et al.    | 257/682 |
| 8,212,326 | B2 | * | 7/2012  | Feyh             | 257/417 |
| 2002/0051258 | A1 | | 5/2002 | Tamura | |
| 2003/0052392 | A1 | | 3/2003 | Amiotti | |
| 2007/0062282 | A1 | | 3/2007 | Akashi et al. | |
| 2008/0136000 | A1 | | 6/2008 | Fischer et al. | |
| 2008/0217752 | A1 | | 9/2008 | Hata et al. | |
| 2009/0020419 | A1 | | 1/2009 | Suzuki et al. | |

FOREIGN PATENT DOCUMENTS

| JP | 2002-5950 A   | 1/2002 |
| JP | 2007-71677 A  | 3/2007 |
| JP | 2008-501535 A | 1/2008 |
| JP | 2008-116423 A | 5/2008 |
| JP | 2008-118147 A | 5/2008 |
| JP | 2008-218811 A | 9/2008 |
| JP | 2009-27016 A  | 2/2009 |
| JP | 2009-117869 A | 5/2009 |

* cited by examiner

Primary Examiner — Paul D Kim
(74) Attorney, Agent, or Firm — Crowell & Moring LLP

(57) ABSTRACT

A movable device of acceleration sensors and a vibration device of a gyroscope are formed on the same sensor wafer spaced apart from each other by a wall. A cap wafer having gaps corresponding to the movable mechanical components of the acceleration sensors and gyroscope is provided for the wafer and an adsorbent divided into a plurality of divisional portions is disposed in the gap for the gyroscope. After the sensor wafer and the cap wafer have been bonded together at a temperature of inactivation of the adsorbent and in an atmospheric pressure ambience of noble gas and activated gas, the adsorbent divisional portions are activated in sequence to adsorb the activated gas so as to adjust the pressure inside the gyroscope, thus manufacturing a combined sensor wafer.

7 Claims, 6 Drawing Sheets

MANUFACTURING METHOD OF COMBINED SENSOR

BACKGROUND OF THE INVENTION

The present invention relates to a method of manufacturing a combined sensor used for measurement of acceleration and angular rate.

A variety of types of capacitive physical sensors have hitherto been presented. In the physical sensor, movable mechanical components such as a vibration device and a movable device are mounted on a silicon substrate or a glass substrate through micromachining technology, drive gaps are formed in a cap substrate at locations corresponding to the movable mechanical components such as the vibration device and the movable device, and these substrates are sealed to each other by bonding or with adhesion. The movable mechanical component has a size of μm order, raising a problem that air resistance and the like factor have influence upon characteristics of the movable mechanical component to degrade them, and therefore, sensing parts must be sealed in pressure ambiences corresponding to the respective vibration device and movable device of the movable mechanical components.

Since acceleration sensors and gyroscopes are mounted on the same substrate in the combined sensor, these sensors are sealed in pressure ambiences in which characteristics of the respective sensors are not degraded. In general, a sensing part of the acceleration sensors are sealed in atmospheric pressure ambient (atmospheric pressure on sealing) and a sensing part of the gyroscope is sealed in vacuum pressure ambience (vacuum pressure on sealing) to ensure that a combined sensor prevented from being degraded in its characteristics can be provided.

The movable mechanical component of gyroscope is a vibration device and when an angular rate is applied to the vibration device being driven to vibrate at a constant frequency, Coriolis force is generated. Being applied with the Coriolis force, the vibration device is displaced. By detecting an amount of displacement of the vibration device due to the Coriolis force, an angular rate can be detected. The higher the driving speed of the vibration device, the more the Coriolis force increases and hence, for the purpose of improving the detection sensitivity of the gyroscope, the vibration device needs to be vibrated at a high frequency and with a large amplitude of several micron meters. The vibration device produced by micromachining is, however, set up in a minute gap and when the atmospheric pressure prevails in driving ambience, the dumping effect of air (sealing gas) is largely influential. The dumping effect has, therefore, an influence upon a vibration of the gyroscope driven at a high frequency and with a large amplitude and as a result, the detection sensitivity of the gyroscope is degraded. Accordingly, by sealing the sensing part of gyroscope in an ambience less affected by the dumping effect, that is, in vacuum ambience, a gyroscope capable of vibrating at the high frequency and with the large amplitude can be obtained.

On the other hand, the acceleration sensors are a movable device having its movable mechanical components such as a mass and a beam and when being applied with an acceleration, the movable device displaces. By detecting an amount of displacement, an acceleration can be detected. When the acceleration sensors are sealed in the same vacuum pressure ambience as that the gyroscope undergoes, the movable device of acceleration sensors are subjected to a small dumping effect to thereby generate a phenomenon that the movable device keeps oscillating and as a result, the acceleration cannot be detected with high sensitivity. Accordingly, the acceleration sensors are sealed in the atmospheric pressure ambience which exhibits a large dumping effect.

JP-A-2002-5950 discloses a publicly known combined sensor having acceleration sensors and a gyroscope in combination, according to which through holes (degassing passages) are formed in a cap substrate for sealing the acceleration sensors and the gyroscope, and after completion of sealing by exerting either the atmospheric pressure or the vacuum pressure on sealing, the through holes are filled either in the atmospheric pressure ambience or in the vacuum pressure ambience so that the acceleration sensors may be sealed in the atmospheric pressure ambience and the gyroscope may be sealed in the vacuum pressure ambience.

Further, in JP-A-2008-501535, the acceleration sensors and the gyroscope are sealed in the atmospheric pressure ambience and thereafter, a through hole is formed in the cap substrate at a location above and corresponding to the gyroscope. Subsequently, the through hole is filled through chemical vapor deposition (CVD) process, so that the gyroscope can be sealed in the pressure ambience for the CVD process, that is, in the vacuum ambience. In the method mentioned as above, the acceleration sensors can be sealed in the atmospheric pressure ambience and the gyroscope can be sealed in the vacuum pressure ambience.

In JP-A-2008-116423, adsorbents (getters) are disposed on a cap substrate for sensors used to detect physical quantities (acceleration and angular rate) in order that a noble gas and an activated gas can be sealed internally at predetermined partial pressures.

In JP-A-2008-118147, an adsorbent (getter) is heated and activated so that activated gases may all be adsorbed to the adsorbent (getter) and so, the interior of a sensor may be sealed in a noble gas pressure ambience.

Each of the aforementioned JP-A-2002-5950 and JP-A-2008-501535 discloses sensors of physical quantities in which after the sensor substrate and the cap substrate have been bonded together, the through holes are filled so that the sensors may be sealed in two kinds of pressure ambiences. Further, in the aforementioned JP-A-2008-116423, after the sensor substrate and the cap substrate have been bonded to each other, the adsorbent (getter) formed on the cap substrate is activated, thereby ensuring that the pressures the sensing parts undergo can be adjusted in accordance with partial pressures of sealed gas.

However, for the sake of improving the detection sensitivities of the acceleration sensors and the gyroscope both disposed on the same substrate, the sensing parts must be sealed in pressure ambiences corresponding to the movable device and vibration device of the respective sensors. Because of sealing on the same substrate, sealing in a pressure ambience corresponding to one of the acceleration sensors and the gyroscope is easy but in order to set up pressure ambiences corresponding to both the sensing parts, the method as described in the aforementioned JP-A-2002-5950 and JP-A-2008-501535 is employed, according to which the through holes are formed in the cap substrate which in turn is bonded to the sensor substrate and thereafter, the through holes are filled with a different material. But, the above method suffers from such a problem that depending on a shrinkage due to a difference in coefficient of linear expansion between silicon or glass and the material filling the through hole and on adhesive intimacy of silicon or glass with the material filling the through hole, leakage takes place through the interface.

Also, as described in JP-A-2008-116423, by disposing the adsorbent (getter) and activating the getter after completion of sealing in the pressure ambience corresponding to one of the sensing parts, the sensor is obtained in which sealing can be done in pressure ambiences corresponding to respective sensing parts. But, the pressures for the sensing parts are determined by the capacity for adsorption of activated gas the adsorbent (getter) has and by the partial pressures of noble gas and activated gas, giving rise to a problem that a fine pressure adjustment cannot be made.

SUMMARY OF THE INVENTION

An object of the present invention is to provide a manufacturing method capable of manufacturing, through a simplified process, a combined sensor having an acceleration detector and an angular rate detector the internal pressures for which are different from each other.

To accomplish the above object, according to the present invention, in a manufacturing method of a combined sensor having an angular rate detector for detecting an angular rate by using a vibration device, an acceleration detector for detecting an acceleration by using a mass and an adsorbent activated to adsorb a specified gas, (a): the vibration device and the adsorbent are sealed hermetically in a first chamber and the mass is sealed hermetically in a second chamber in an ambience of the specified gas mixed with a different gas at a predetermined ratio and (b): thereafter, the adsorbent is activated, the specified gas being a noble gas or inactive gas and the other gas being also the noble gas or inactive gas.

Also, to accomplish the aforementioned object, according to the present invention, in a manufacturing method of a combined sensor having an angular rate detector for detecting an angular rate by using a vibration device, an acceleration detector for detecting an acceleration by using a mass and a desorption agent being activated to desorb a specified gas, (a): the vibration device is sealed hermetically in a first chamber and the mass and the desorption agent having adsorbed the specified gas are sealed hermetically in a second chamber and (b): thereafter, the desorption agent is activated, the specified gas being a noble gas or inactive gas and the other gas being also the noble gas or inactive gas.

According to the present invention, a combined sensor having an acceleration detector and an angular rate detector, the internal pressures for which are different from each other, can be manufactured through a simplified process.

Other objects, features and advantages of the invention will become apparent from the following description of the embodiments of the invention taken in conjunction with the accompanying drawings.

DESCRIPTION OF THE EMBODIMENTS

Embodiments of the present invention will now be described with reference to the accompanying drawings.

[Embodiment 1]

Figure 1:
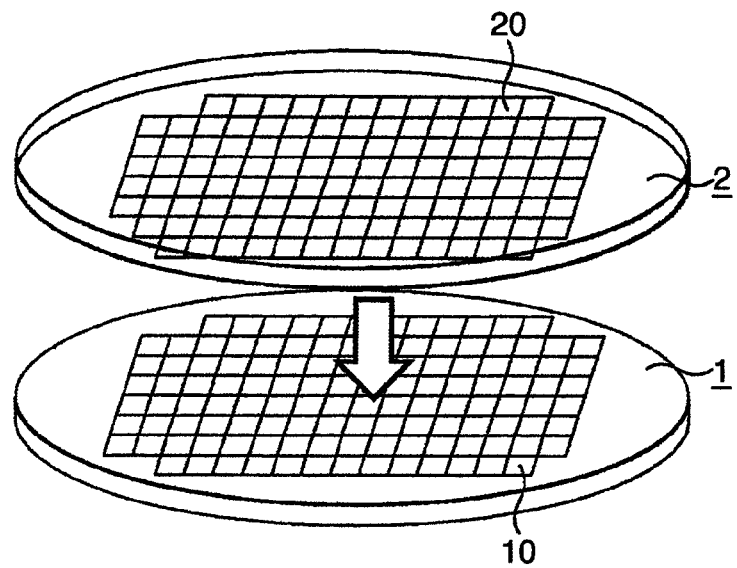
FIG. 1 is a diagram useful to explain the bonding of wafers in an embodiment of the invention.

Referring first to FIG. 1, a sensor wafer 1, on which a plurality of sensor substrates 10 each comprised of acceleration sensors and a gyroscope are arranged, and a cap wafer 2, on which a plurality of cap substrates 20 each corresponding to the acceleration sensors and the gyroscope, are bonded to each other. The individual sensor substrates 10 of sensor wafer 1 are sealed with the individual cap substrates 20 of cap wafer 2 and thereafter they are packaged with a wiring substrate having external input/output terminals and an integrated circuit for detection and correction, and individual electrodes are connected to one another by wire bonding to set up a combined sensor.

Arranged in the sensor wafer 1 are a plurality of sensors each formed in a space in which a vibration device of gyroscope which vibrates to displace itself by Coriolis force due to an angular rate is disposed separately by a wall from a movable device of acceleration sensors which moves to displace itself under application of an acceleration. Then, the cap wafer for sealing the individual sensors is mounted on the sensor wafer.

A plurality of gaps are formed in the cap wafer 2 at locations corresponding the individual sensors and a plurality of divisions of an adsorbent (getter) for pressure adjustment are disposed in gaps associated with the gyroscopes, respectively. When the material of the cap substrate is Si, a heating element is provided for the bottom surface of each of the divisional adsorbents. The heating element is constituted by an electrode pad and resistive wiring and for the heating element, a high resistivity material, for example, nichrome, tungsten or the like is selected. When the material of the cap substrate is glass, the adsorbent is divided simply without heating element. A plurality of divisions of a desorption agent having adsorbed a specified gas may be provided for the individual gaps for acceleration sensors, respectively. Used as the adsorbent (getter) is, for example, PaGe Wafer produced by saes getters.

As the material for mutual bonding and sealing of the sensor wafer 1 and cap wafer 2, a material is selected which can permit bonding at a temperature at which the absorbent (getter) or desorption agent is not activated, for example, such a material bondable by itself at low temperatures as Sn—Ag (221° C.), Sn—Zn (199° C.), Sn—Ag—In (220° C.), Sn—Cu (227° C.) or Sn—Au (278° C.). Alternatively, the sensor wafer and the cap wafer may be bonded together by surface activated bonding or anodic bonding.

With the adsorbent (getter) used, the sensor wafer 1 and cap wafer 2 are bonded to each other at the wafer level in an ambience of a mixture of noble gas and activated gas and subsequently, when inspecting the vibration device of gyroscope, the adsorbent (getter) is activated to adsorb he activated gas, thereby adjusting the pressure inside the gyroscope. For adjustment, in the case of the cap substrate being of glass, the temperature of adsorbent (getter) is raised by means of a laser bean, for instance, irradiated from above the cap substrate. In the case of the cap substrate being of silicon, current is passed sequentially through the heating element provided for the bottom surface of the adsorbent (getter) to raise its temperature, thus activating it. The adsorbent is divided and its divisions are arranged and therefore, the pressure adjustment ends at a divisional adsorbent where driving at a desired pressure is ensured.

On the other hand, with the desorption agent used, the sensor wafer and cap wafer are bonded to each other at the wafer level in vacuum pressure ambience of noble gas and subsequently, when inspecting the acceleration sensors, the desorption agent is activated to desorb the specified gas, thereby adjusting the pressure inside the acceleration sensors. For adjustment, in the case of the cap substrate being of glass, the temperature of desorption agent is raised by means of a laser beam, for instance, irradiated from above the cap substrate. In the case of the cap substrate being of silicon, current is passed sequentially through the heating element provided for the bottom surface of the desorption agent to raise its temperature, thus activating it. The desorption agent is divided and its divisions are arranged and therefore, the pressure adjustment ends at a divisional desorption agent where driving at a desired pressure is ensured.

Through the above process for adjusting the pressure inside the combined sensor, fine pressure adjustment can be attained and the yield on pressure distribution in the combined sensor substrate can be improved.

After the inspection at the wafer level and the activation of adsorbent (getter) or desorption agent have been finished, the combined sensor wafer is diced into combined sensor substrates. For dicing, a dicing method based on a diamond dicing saw or a dicing method using a laser can be used.

A circuit substrate on which a circuit for amplifying and detecting displacements of the acceleration sensors and gyroscope and a circuit for correcting the influence of temperature and packaging inclination are arranged is disposed on a wiring substrate having external input/output terminals (for example, a lead frame, a ceramic package and the like) and the combined sensor substrate is packaged on the circuit substrate. Electrode pads of each of the respective combined sensor substrate, circuit substrate and wiring substrate are connected to one another by wire conductors of Au, for instance.

With the wiring substrate such as a lead frame used, resin sealing is effected through injection molding, potting and the like process. With the wiring substrate such as a ceramic package used, on the other hand, sealing is effected by bonding a cap through soldering, for example.

With the combined sensor constructed as above, a combined sensor and its manufacturing method can be provided in which the acceleration sensors and the gyroscope on the same substrate can be sealed in driving ambiences specified to them, respectively, and the combined sensor can be manufactured at low costs.

Figure 8A:
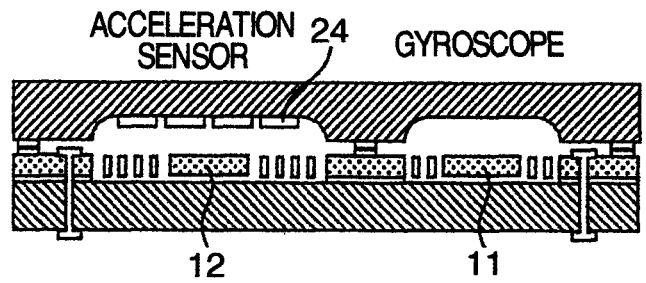
FIG. 8A is a longitudinal sectional view illustrating an embodiment of a combined sensor according to the invention.
Figure 8B:
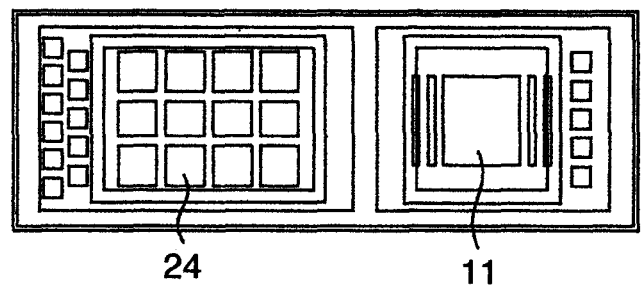
FIG. 8B is an inner top view illustrating the FIG. 8A combined sensor.
Figure 8C:
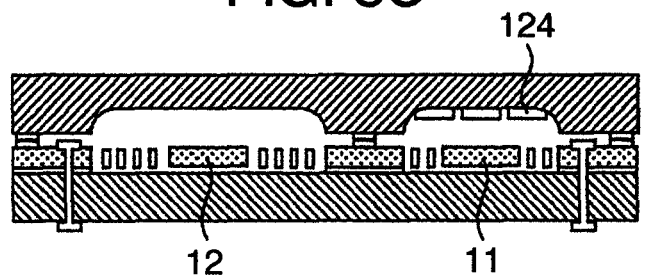
FIG. 8C is a longitudinal sectional view illustrating another embodiment of a combined sensor according to the invention.
Figure 8D:
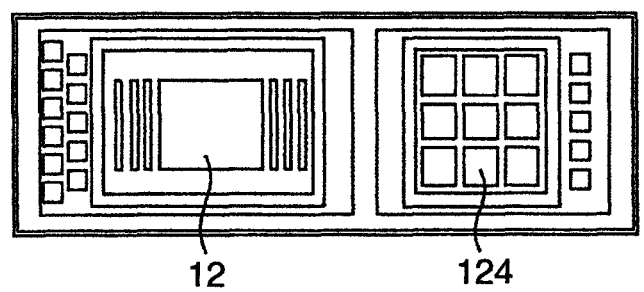
FIG. 8D is an inner top view illustrating the FIG. 8C combined sensor.

Turning to FIGS. 8A to 8D, combined sensors manufactured in accordance with the present embodiment is illustrated, with FIGS. 8A and 8B showing a combined sensor with an adsorbent in longitudinal sectional form and in inner plan view form, respectively, and with FIGS. 8C and 8D showing a combined sensor with a desorption agent in longitudinal sectional form and in internal plan view form, respectively.

In the condition as shown in FIG. 8A, a plurality of kinds of gases of noble gas and/or activated gas setting up an ambience at the time of bonding the sensor wafer 1 and the cap wafer 2 together remain intact around the movable device 11 (mass) for detection of acceleration. On the other hand, the adsorbent 24 totally or partly activated and having adsorbed gasses is disposed nearby the vibration device 12 for detection of angular rates and so, out of the gases setting up the ambience during bonding of the sensor wafer 1 and cap wafer 2, gases not adsorbed by the adsorber remain around the vibration device 12. The pressure around the vibration device 12 is smaller than that around the movable device 11.

By examining a product, it has been proven that the plural kinds of gasses of noble gas and/or inactive gas exist around the movable device 11 and less kinds of gasses than those around the movable device 11 and adsorbent 24 activated partly or wholly exist nearby the vibration device 12.

In the condition as shown in FIG. 8C, the gas setting up the ambience during bonding of the sensor wafer 1 and cap wafer 2 still remain intact around the vibration device 12. On the other hand, a desorption agent 124 activated wholly or partly and having desorbed gases prevails, so that in addition to the gases setting up the ambience during bonding of the sensor wafer 1 and cap wafer 2, other kinds of gases desorbed from the desorption agent remain around the movable device 11. Accordingly, the pressure around the vibration device 12 is smaller than that around the movable device 11.

By examining a product, it has been proven that the plural kinds of gasses of noble gas and/or inactive gas and the desorption agent activated wholly or partially exist around the movable device 11 and accordingly, less kinds of gasses than those around the movable device 11 exist around the vibration device 12.

Details of the individual constituent members will further be described with reference to FIGS. 2A and 2B and ensuing figures.

Figure 2A:
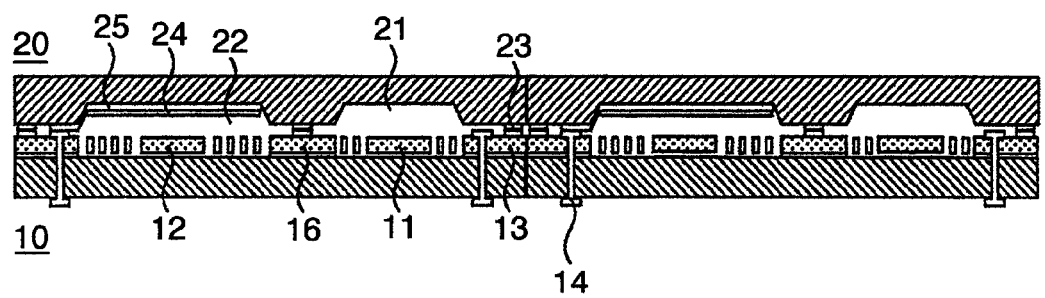
FIG. 2A is a longitudinal sectional view illustrating a first embodiment of combined sensors according to the invention.
Figure 2B:
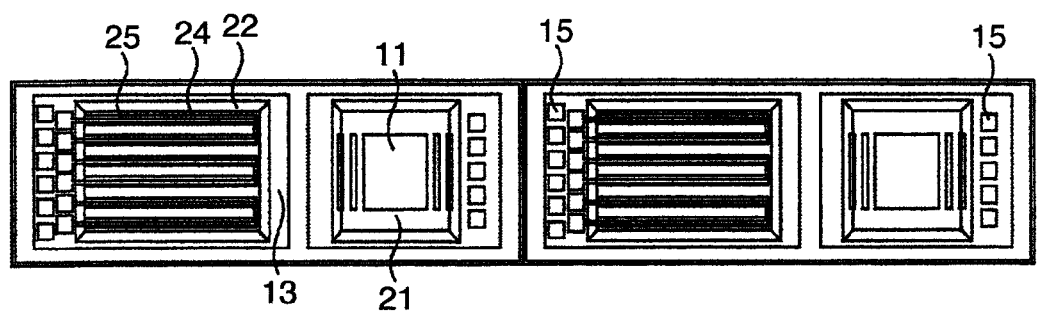
FIG. 2B is an inner top view illustrating the first embodiment of the combined sensors according to the invention.

Illustrated in FIGS. 2A and 2B are part of the resultant structure of sensor wafer 1 and cap wafer 2 bonded together in longitudinal sectional view and inner top view, respectively.

In a sensor substrate 10, a movable device 11 of acceleration sensors, a vibration device 12 of gyroscope, a bonding member 13 for bonding the sensor substrate 10 to a cap substrate 20 and electrodes 15 for input/output of external signals are formed on a SOI (silicon on insulator) substrate. The SOI substrate is a substrate having a silicon oxide layer between silicon and silicon. The movable device 11 (mass) and vibration device 12 are formed, on one side of the SOI substrate, through Si DRIE (deep reactive ion etching) process. Thereafter, by removing the silicon oxide film, the SOI substrate is released to expose the movable device 11 and vibration device 12. The movable device 11 and vibration device 12 are spaced apart from each other by a wall 16. The movable device 11 of acceleration sensors and the vibration device 12 of gyroscope are connected to the electrodes 15 and driving and detection of displacement amounts are carried out through the electrodes 15.

Then, the cap substrate 20 is made of silicon and constituted by a gap 21 for acceleration sensors, a gap 22 for gyroscope and a bonding member 23 for bonding to the sensor substrate 10, with an adsorbent (getter) 24 being formed on a heating element 25 within the gap 22 for gyroscope. The gaps 21 and 22 of acceleration sensors and gyroscope are formed in the cap wafer 2 through anisotropic etching or dry etching. Thereafter, wiring of a heating element 25 and the adsorbent (getter) 24 are formed in the gap 22 for gyroscope. The heating element 25 and adsorbent (getter) 24 are divided into a plurality of divisional portions. As the material of heating element 25, a material of high resistivity such as nichrome, tungsten or the like is used. The adsorbent (getter) 24 resembles that described in JP-A-2008-118147 and a metal material or an alloy capable of adsorbing, at high temperatures, the activated gas is used. For example, PaGe Wafer made of saes getters may be used therefor.

After completion of alignment of the sensor wafer 1 with the cap wafer 2, a mixture of noble gas and activated gas, for example, the noble gas being at 200 Pa and the activated gas being at 999800 Pa are adjusted to the atmospheric pressure ambience and the absorbent (getter) 24 is set at a deactivated temperature, followed by application of a load to bond both the wafers through the medium of the bonding members 13 and 23. As the material of the bonding members 13 and 23, Sn—Ag (221° C.), Sn—Zn (199° C.), Sn—Ag—In (220° C.), Sn—Cu (227° C.) or Sn—Au (278° C.) is selectively used which is bondable by itself at low temperatures and meets the activation temperature of the adsorbent (getter) 24. At least one kind of gasses Ar, Kr and Xe is used as the noble gas and at least one kind of gases $CO_2$, $H_2$, $O_2$ and CO is used as the activated gas.

While in the present embodiment, the electrodes 14 of sensor substrate 10 are connected to the heating element 25, electrodes connecting to the heating element 25 may be formed on the cap wafer 2.

After the sensor wafer 1 and cap wafer 2 have been bonded together, a signal is inputted from the electrodes at the time of inspection of the gyroscope to drive the vibration device 12 and in this phase, by passing currents through the electrodes 14, the heating element 25 is heated to activate the plurality of divisions of the adsorbent (getter) 24 in sequence, causing the activated gas to be adsorbed. When a predetermined driving sensitivity can be obtained, the activation of the adsorbent 24 is ended. Through the above process, the acceleration sensors 11 can be sealed in the atmospheric pressure ambience of noble gas (200 Pa) and activated gas (999800 Pa) whereas the gyroscope can be sealed in the vacuum ambience of noble gas (200 Pa) and remaining activated gas not adsorbed by the adsorbent (getter) 24. By adjusting the degree of activation of the adsorbent 24, unevenness of driving sensitivity of the sensor can be reduced within the wafer.

[Embodiment 2]

Figure 3A:
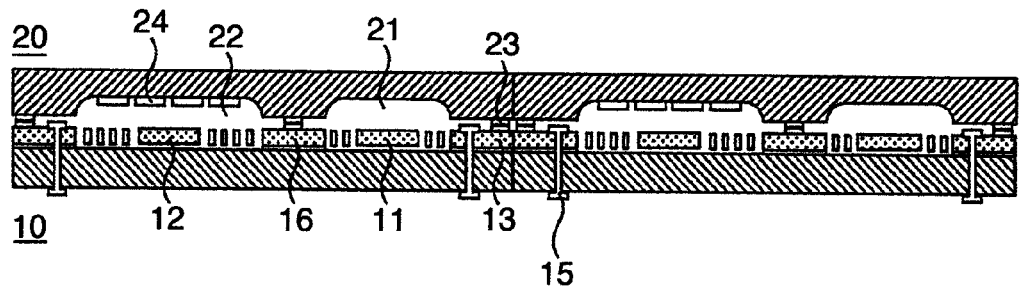
FIG. 3A is a longitudinal sectional view illustrating a second embodiment of combined sensors according to the invention.
Figure 3B:
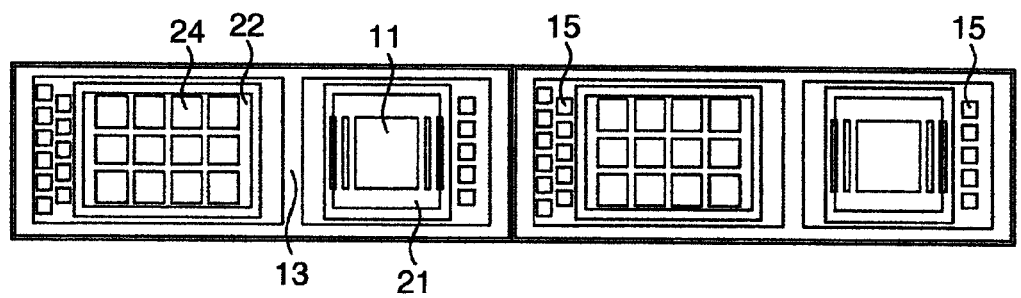
FIG. 3B is an inner top view illustrating the second embodiment of the combined sensors according to the invention.

A second embodiment according to the invention will now be described by making reference to FIGS. 3A and 3B illustrating part of sensor wafer 1 and cap wafer 2 in longitudinal sectional view and inner top view, respectively.

In a sensor substrate 10, a movable device 11 of acceleration sensors, a vibration device 12 of gyroscope, a bonding member 13 for bonding the sensor substrate to a cap substrate 20 and electrodes 15 for input/output of external signals are formed on a SOI (silicon on insulator) substrate. The SOI substrate is a substrate having a silicon oxide layer between silicon and silicon. The movable device 11 and vibration device 12 are formed, on one side of the SOI substrate, through Si DRIE (deep reactive ion etching) process. Thereafter, by removing the silicon oxide film, the SOI substrate is released to expose the movable device 11 and vibration device 12. The movable device 11 and vibration device 12 are spaced apart from each other by a wall 16. The movable device 11 of acceleration sensors and the vibration device 12 of gyroscope are connected to the electrodes 15 and driving and detection of displacement amounts are carried out through the electrodes 15.

Then, the cap substrate 20 made of glass is constituted by a gap 21 for acceleration sensors, a gap 22 for gyroscope and a bonding member 23 for bonding to the sensor substrate 10, with a plurality of adsorbents (getters) 24 being formed in the gap 22 for gyroscope. The gaps 21 and 22 for acceleration sensors and gyroscope are formed in the cap wafer 2 through isotropic etching or sandblasting. Thereafter, adsorbents (getters) 24 are formed in the gap 22. The adsorbent (getter) 24 resembles that described in JP-A-2008-118147 and a metal material or an alloy capable of adsorbing, at high temperatures, the activated gas is used. For example, PaGe Wafer made of saes getters may be used therefor.

After completion of alignment of the sensor wafer 1 with the cap wafer 2, a mixture of noble gas and activated gas, for example, the noble gas being at 100 Pa and activated gas being at 999900 Pa, are adjusted to the atmospheric pressure ambience and the absorbents (getters) 24 are set at an inactive temperature, followed by application of a load to bond both the wafers through the medium of the bonding members 13 and 23. As the material of the bonding members 13 and 23, Sn—Ag (221° C.), Sn—Zn (199° C.), Sn—Ag—In (220° C.), Sn—Cu (227° C.) or Sn—Au (278° C.) is used selectively which is bondable by itself at low temperatures and meets the activation temperature of the adsorbents (getters) 24. Apart from the above bonding material, the bonding can be effected through anodic bonding or surface activated bonding. At least one kind of gasses Ar, Kr and Xe is used as the noble gas and at least one kind of gases $CO_2$, $H_2$, $O_2$ and CO is used as the activated gas.

After the sensor wafer 1 and cap wafer 2 have been bonded together, a signal is inputted at the time of inspection of the gyroscope to drive the vibration device 12 and in this phase, a laser beam is irradiated from above the cap wafer 2 to activate the plurality of adsorbents (getters) 24 in sequence, causing the activated gas to be adsorbed. When a predetermined driving sensitivity can be obtained, the activation of the adsorbents 24 is ended. Through the above process, the acceleration sensors can be sealed in the atmospheric pressure ambience of noble gas (100 Pa) and the activated gas (999900 Pa) whereas the gyroscope can be sealed in the vacuum ambience of noble gas (100 Pa) and remaining activated gas not adsorbed by the adsorbents (getters) 24. By adjusting the degree of activation of the adsorbent 24, unevenness of driving sensitivity of the sensor can be reduced within the wafer.
[Embodiment 3]

Figure 4A:
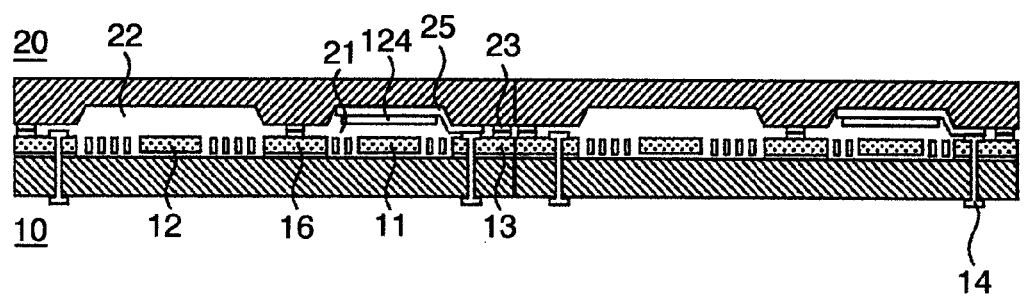
FIG. 4A is a longitudinal sectional view illustrating a third embodiment of combined sensors according to the invention.
Figure 4B:
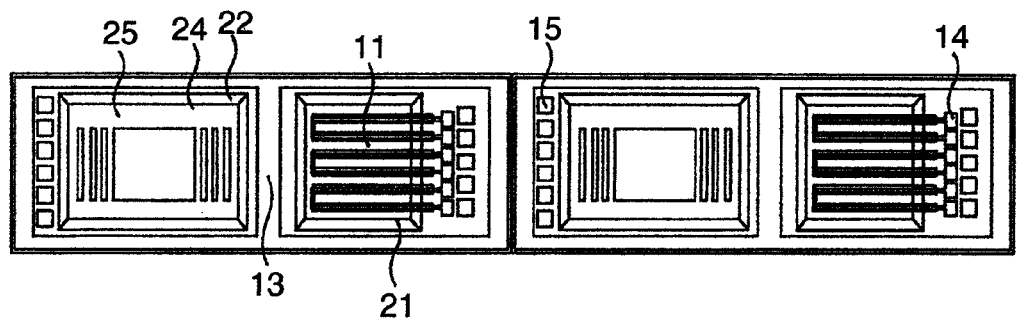
FIG. 4B is an inner top view illustrating the third embodiment of the combined sensors according to the invention.

A third embodiment according to the invention will be described by making reference to FIGS. 4A and 4B illustrating part of sensor wafer 1 and cap wafer 2 in longitudinal sectional view and inner top view, respectively.

In a sensor substrate 10, a movable device 11 of acceleration sensors, a vibration device 12 of gyroscope, a bonding member 13 for bonding the sensor substrate 10 to a cap substrate 20 and electrodes 15 for input/output of external signals are formed on a SOI (silicon on insulator) substrate. The SOI substrate is a substrate having a silicon oxide layer between silicon and silicon. The movable device 11 and vibration device 12 are formed, on one side of the SOI substrate, through Si DRIE (deep reactive ion etching) process. Thereafter, by removing the silicon oxide film, the SOI substrate is released to expose the movable device 11 and vibration device 12. The movable device 11 and vibration device 12 are spaced apart from each other by a wall 16. The movable device 11 of acceleration sensors and the vibration device 12 of gyroscope are connected to the electrodes 15 and driving and detection of displacement amounts are carried out through the electrodes 15.

Then, the cap substrate 20 made of silicon is constituted by a gap 21 for acceleration sensors, a gap 22 for gyroscope and a bonding member 23 for bonding to the sensor substrate 10, with a desorption agent 124 being formed on a heating element 25 within the gap 21 for acceleration sensors. The gaps 21 and 22 for acceleration sensors and gyroscope are formed in the cap wafer 2 through anisotropic etching or dry etching. Thereafter, wiring of the heating element 25 and desorption agent 124 are formed in the gap 21 for acceleration sensors. The heating element 25 and desorption agent 124 are divided into a plurality of divisional portions. As the material of heating element 25, a material of high resistivity such as nichrome, tungsten or the like is used. For the desorption agent 124, at least one kind of a metal material, an alloy, an alloy compound and a semiconductor material capable of desorbing, at high temperatures, activated gas or a combination of these materials can be used.

After completion of alignment of the sensor wafer 1 with the cap wafer 2, a noble gas is adjusted to a vacuum pressure ambience corresponding to the gyroscope, for example, to 300 Pa and the desorption agent 124 is set at an inactive temperature, followed by application of a load to bond both the wafers through the medium of the bonding members 13 and 23. As the material of the bonding members 13 and 23, Sn—Ag (221° C.), Sn—Zn (199° C.), Sn—Ag—In (220° C.), Sn—Cu (227° C.) or Sn—Au (278° C.) is used selectively which is bondable by itself at low temperatures and meets the activation temperature of the desorption agent 124. At least one kinds of gasses Ar, Kr and Xe is used as the noble gas.

While in the present embodiment, the electrodes 14 of sensor substrate 10 are connected to the heating element 25, electrodes connecting to the heating element 25 may be formed on the cap wafer.2.

After the sensor wafer 1 and cap wafer 2 have been bonded together, the mass is driven at the time of inspection of the acceleration sensors and in this phase, by passing currents through the electrodes 14, the heating element 25 is heated to activate the plurality of divisions of the desorption agent 124 in sequence, causing the specified gas to be desorbed. When a predetermined driving sensitivity can be obtained, the activation of the desorption agent 124 is ended. Through the above process, the acceleration sensors can be sealed in the atmospheric pressure ambience of noble gas (300 Pa) and specified gas (999700 Pa) whereas the gyroscope can be sealed in the vacuum ambience of noble gas (300 Pa). By adjusting the degree of activation of the desorption agent 124, unevenness of driving sensitivity of the sensor can be reduced within the wafer.
[Embodiment 4]

Figure 5A:
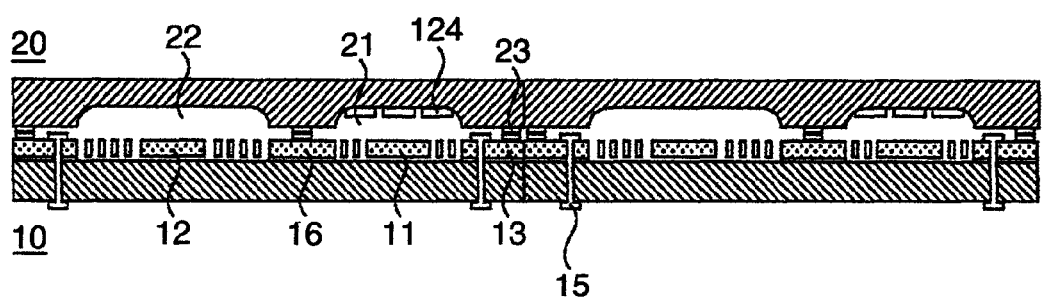
FIG. 5A is a longitudinal sectional view illustrating a fourth embodiment of combined sensors according to the invention.
Figure 5B:
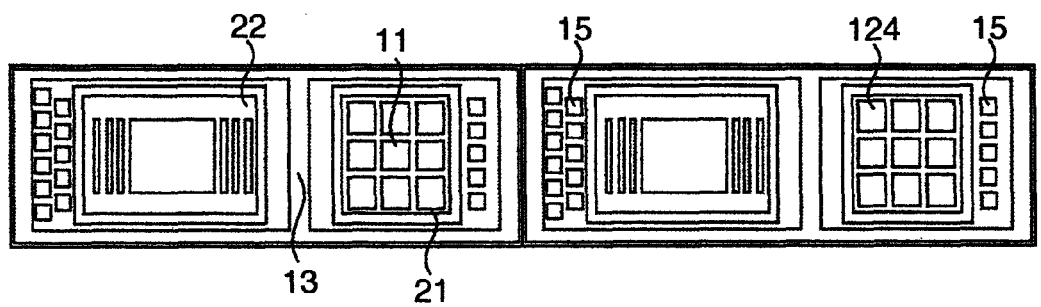
FIG. 5B is an inner top view illustrating the fourth embodiment of the combined sensors according to the invention.

A fourth embodiment according to the invention will be described by making reference to FIGS. 5A and 5B illustrating part of sensor wafer 1 and cap wafer 2 in longitudinal sectional view and inner top view, respectively.

In a sensor substrate 10, a movable device 11 of acceleration sensors, a vibration device 12 of gyroscope, a bonding member 13 for bonding the sensor substrate 10 to a cap substrate 20 and electrodes 15 for input/output of external signals are formed on a SOI (silicon on insulator) substrate. The SOI substrate is a substrate having a silicon oxide layer between silicon and silicon. The movable device 11 and vibration device 12 are formed, on one side of the SOI substrate, through Si DRIE (deep reactive ion etching) process. Thereafter, by removing the silicon oxide film, the SOI substrate is released to expose the movable device 11 and vibration device 12. The movable device 11 and vibration device 12 are spaced apart from each other by a wall 16. The movable device 11 of acceleration sensors and the vibration device 12 of gyroscope are connected to the electrodes 15 and driving and detection of displacement amounts are carried out through the electrodes 15.

Then, the cap substrate 20 made of glass is constituted by a gap 21 for acceleration sensors, a gap 22 for gyroscope and a bonding member 23 for bonding to the sensor substrate 10, with a plurality of desorption agents 124 being formed in the gap 21 for acceleration sensors. The gaps 21 and 22 for acceleration sensors and gyroscope are formed in the cap substrate 20 through isotropic etching or sandblasting. Thereafter, the desorption agents 124 are formed in the gap 21 for acceleration sensors. For the desorption agent 124, at least one kind of a metal material, an alloy, an alloy compound and a semiconductor material capable of desorbing, at high temperatures, specified gas or a combination of these materials can be used. For example, CO gas has been adsorbed to Pt to cause a small amount of $O_2$ to be sealed and CO and $O_2$ are reacted with each other to generate $CO_2$ which in turn is desorbed.

After completion of alignment of the sensor wafer 1 with the cap wafer 2, a noble gas is adjusted to a vacuum pressure ambience corresponding to the gyroscope, for example, to 300 Pa and the desorption agents 124 are set at an inactive temperature, followed by application of a load to bond both the wafers through the medium of the bonding members 13 and 23. As the material of the bonding members 13 and 23, Sn—Ag (221° C.), Sn—Zn (199° C.), Sn—Ag—In (220° C.), Sn—Cu (227° C.) or Sn—Au (278° C.) is used selectively which is bondable by itself at low temperatures and meets the activation temperature of the desorption agent 124. Apart from the above bonding material, the bonding can be effected through anodic bonding or surface activated bonding. At least one kind of gasses Ar, Kr and Xe is used as the noble gas.

After the sensor wafer 1 and cap wafer 2 have been bonded together, the mass is driven at the time of inspection of the acceleration sensors and in this phase, a laser beam is irradiated from above the cap wafer 2 to activate the plurality of divisional desorption agents 124 in sequence, causing the specified gas to be desorbed. When a predetermined driving sensitivity can be obtained, the activation of the desorption agent 124 is ended. Through the above process, the acceleration sensors can be sealed in the atmospheric pressure ambience of noble gas (300 Pa) and specified gas (999700 Pa)

whereas the gyroscope can be sealed in the vacuum ambience of noble gas (300 Pa). By adjusting the degree of activation of the desorption agents 124, unevenness of driving sensitivity of the sensor can be reduced within the wafer.

[Embodiment 5]

Figure 6A:
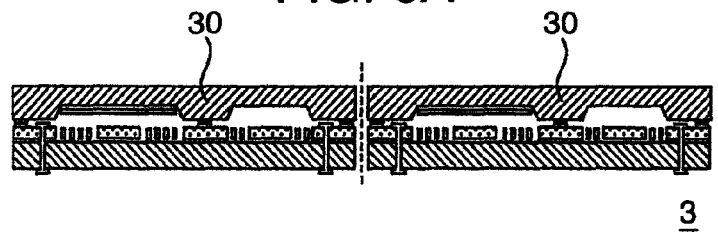
FIG. 6A is a longitudinal sectional view useful to explain fabrication of a single combined sensor according to a fifth embodiment of the invention.

A fifth embodiment according to the present invention will be described by making reference to FIGS. 6A to 6E illustrating, in sectional form, a process in which the combined sensor wafer described in connection with embodiments 1 to 4 is diced and packaged to provide a combined sensor. As shown in FIG. 6A, a combined sensor wafer 3 is diced by using a diamond saw so as to be divided into combined sensors 30. The combined sensor wafer 3 may be divided by dicing based on $CO_2$ laser, for example, so as to be divided into the combined sensors 30.

Figure 6B:
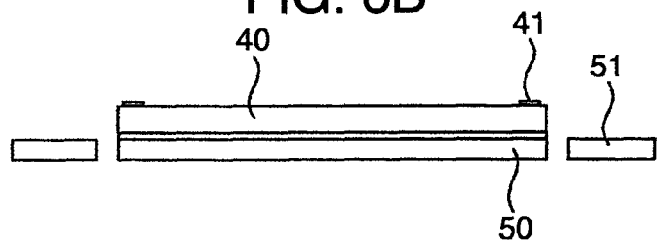
FIG. 6B is a side view schematically illustrating a circuit board, a wiring board and electrodes in the fifth embodiment according to the invention.
Figure 6C:
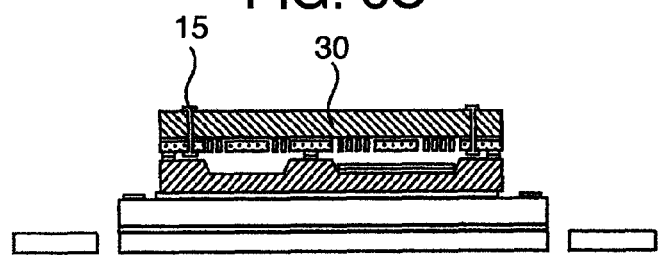
FIG. 6C is a diagram illustrating, in longitudinal sectional view, a single combined sensor mounted on the structure shown in FIG. 6B.
Figure 6D:
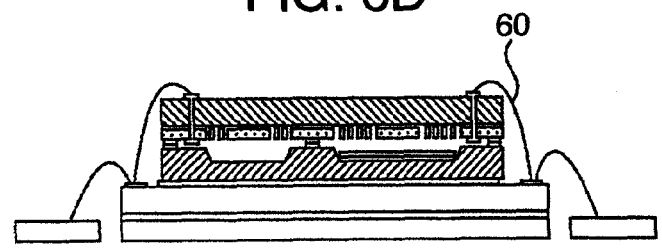
FIG. 6D is a diagram showing wiring interconnection in the structure shown in FIG. 6C.
Figure 6E:
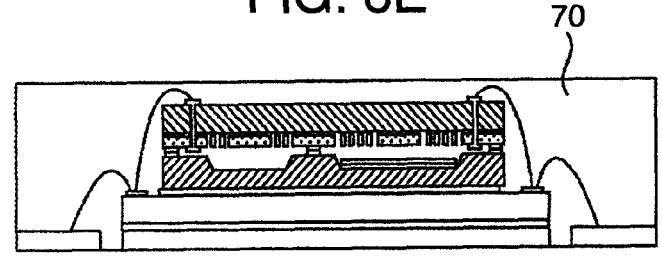
FIG. 6E is a diagram illustrating sealing of the structure shown in FIG. 6D.

A circuit substrate 40 carrying a circuit for detection of displacement of the combined sensor and a circuit for correction of temperature and inclination is fixedly mounted on a wiring substrate 50 such as a lead frame constituted by metallic electrodes 51 for external input/output by using a di-attach film, Ag paste or the like, as shown in FIG. 6B. Then, as shown in FIG. 6C, the combined sensor 30 is fixedly mounted on the circuit substrate 40 by using a di-attach film, Si adhesive or the like. Subsequently, as shown in FIG. 6D, the electrodes 15 of combined sensor 30, the electrodes 41 of circuit substrate 40 and the electrodes 51 of wiring substrate 50 are interconnected to one another through wires 60. Finally, the combined sensor 30, the circuit substrate 40, the wiring substrate 50 and wires 60 are sealed with resin as shown at 70 in FIG. 6E. As the resin material, epoxy resin mixed with particle of, for example, silica is used. The resulting structure develops to a semiconductor packaging process, thus obtaining a low-cost combined sensor.

[Embodiment 6]

Figure 7A:
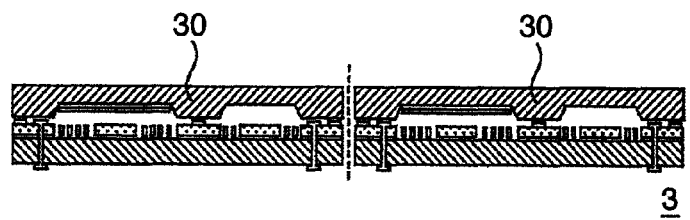
FIG. 7A is a longitudinal sectional view useful to explain fabrication of a single combined sensors according to a sixth embodiment of the invention.

A sixth embodiment according to the present invention will be described by making reference to FIGS. 7A to 7E illustrating, in sectional form, a process in which the combined sensor wafer described in connection with embodiments 1 to 4 is diced and packaged to provide a combined sensor. As shown in FIG. 7A, a combined sensor wafer 3 is diced by using a diamond saw so as to be divided into combined sensors 30.

Figure 7B:
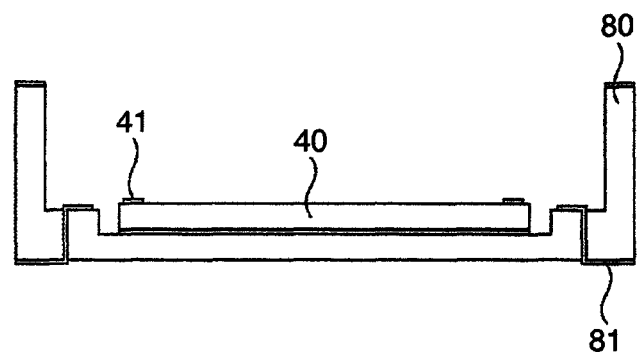
FIG. 7B is side view schematically illustrating a circuit board and a ceramic package in the sixth embodiment of the invention.
Figure 7C:
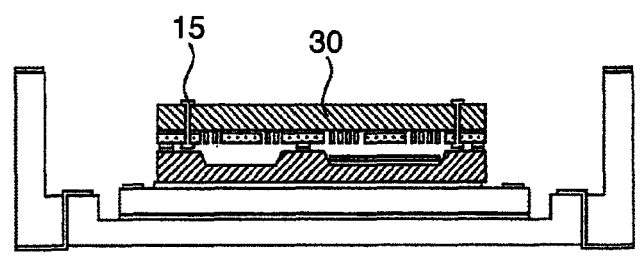
FIG. 7C is a diagram illustrating, in longitudinal sectional view, a single combined sensor mounted on the circuit board in the sixth embodiment of the invention.
Figure 7D:
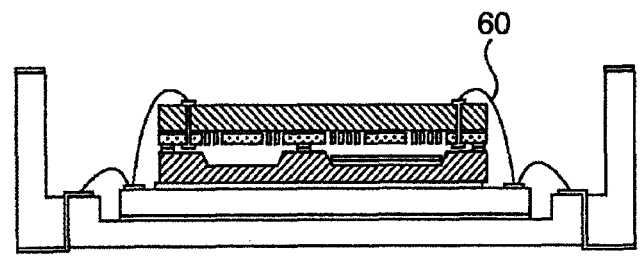
FIG. 7D is a diagram showing wiring interconnection in the structure shown in FIG. 7C.

A circuit substrate 40 carrying a circuit for detection of displacement of the combined sensor 30 and a circuit for correction of temperature and inclination is mounted on a ceramic package 80 having electrodes 81 for external input/output connected to a multi-layer wiring of ceramics by using a di-attach film or Ag paste, as shown in FIG. 7B. Then, as shown in FIG. 7C, the combined sensor 30 is fixedly mounted on the circuit substrate 40 by using a di-attach film, Si adhesive or the like. Subsequently, as shown in FIG. 7D, the electrodes 15 of combined sensor 30, the electrodes 41 of circuit substrate 40 and the electrodes 81 of ceramic package 80 are interconnected to one another through wires 60.

Figure 7E:
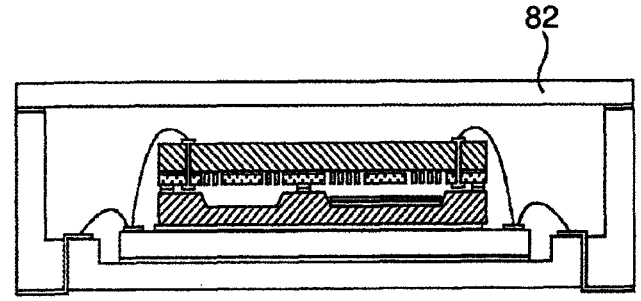
FIG. 7E is a diagram illustrating sealing of the structure shown in FIG. 7D.

Finally, a lid 82 is soldered to the edge of opening of ceramic package 80 in an activated gas ambience as shown in FIG. 7E. In the thus obtained structure, a two-stage sealing structure having sealing of the sensing parts of combined sensor substrate established by the cap substrate and sealing set up by the ceramic package can be attained to thereby provide a combined sensor of improved sealing reliability.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A method of manufacturing a combined sensor having an angular rate detector adapted to detect an angular rate by using a vibration device, an acceleration detector adapted to detect an acceleration by using a mass and an adsorbent activated to adsorb a specified gas is an active gas, and a different gas is a noble gas or an inactive gas, comprising the steps of:

hermetically sealing said vibration device and said adsorbent in a first chamber and said mass in a second chamber in an ambience of said specified gas mixed with a different gas is the noble gas or the inactive gas at a predetermined ratio; and activating thereafter said adsorbent.

2. The combined sensor manufacturing method according to claim 1, wherein said adsorbent is activated wholly or partly so that the pressure in said first chamber may amount to a desired level.

3. The combined sensor manufacturing method according to claim 2, wherein said adsorbent is divided into a plurality of divisional portions and one or ones are selected from said plurality of divisional portions so as to be activated to thereby set up a desired pressure in said first chamber.

4. The combined sensor manufacturing method according to claim 3, wherein said adsorbent is activated by conducting current to a heating element provided nearby said adsorbent or by irradiating a laser beam on said adsorbent.

5. The combined sensor manufacturing method according to claim 4, wherein a plurality of sets of said first and second chambers are formed by bonding or adhering a single silicon wafer formed with said vibration devices and said masses to another substrate.

6. The combined sensor manufacturing method according to claim 5, wherein said another substrate is made of glass or silicon.

7. The combined sensor manufacturing method according to claim 6, wherein after said adsorbent has been activated, said silicon wafer and said another substrate are diced to form a plurality of combined sensors each having a pair of said first chamber and said second chamber.

* * * * *